United States Patent
Sonoda et al.

(10) Patent No.: US 7,546,506 B2
(45) Date of Patent: Jun. 9, 2009

(54) DRAM STACKED PACKAGE, DIMM, AND SEMICONDUCTOR MANUFACTURING METHOD

(75) Inventors: Yuji Sonoda, Hiratsuka (JP); Shuji Kikuchi, Yokohama (JP); Katsunori Hirano, Yokohama (JP); Ichiro Anjo, Koganei (JP); Mitsuaki Katagiri, Nishitokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 501 days.

(21) Appl. No.: 11/378,368

(22) Filed: Mar. 20, 2006

(65) Prior Publication Data

US 2006/0239055 A1 Oct. 26, 2006

(30) Foreign Application Priority Data

Apr. 7, 2005 (JP) .............................. 2005-110752

(51) Int. Cl.
*G01R 31/28* (2006.01)
(52) U.S. Cl. ...................................... 714/738; 714/736
(58) Field of Classification Search ................. 714/724, 714/736, 738, 718, 769; 365/200, 201
See application file for complete search history.

(56) References Cited

U.S. PATENT DOCUMENTS

| 5,123,016 A | 6/1992 | Muller et al. |
| 6,515,922 B1 | 2/2003 | Yamagata |
| 6,528,817 B1 | 3/2003 | Koga et al. |
| 6,590,816 B2 | 7/2003 | Perner |
| 6,961,881 B2 * | 11/2005 | Yamazaki et al. ........... 714/718 |
| 7,137,055 B2 * | 11/2006 | Hirano et al. ............... 714/738 |
| 7,441,166 B2 * | 10/2008 | Yamada et al. .............. 714/718 |
| 2005/0149803 A1 | 7/2005 | Hirano et al. |

FOREIGN PATENT DOCUMENTS

| JP | 9-504654 | 5/1997 |
| JP | 2001-035188 | 2/2001 |
| JP | 2003-223799 | 8/2003 |
| JP | 2005-182866 | 7/2005 |
| KR | 2003-0023850 | 3/2003 |
| WO | WO 95-05676 | 2/1995 |

OTHER PUBLICATIONS

Search Report in Taiwanese Patent Application No. 095107071 mailed Apr. 27, 2009. (No English translation).

* cited by examiner

*Primary Examiner*—Phung M Chung
(74) *Attorney, Agent, or Firm*—Brundidge & Stanger, P.C.

(57) ABSTRACT

The present invention relates to a DRAM stacked packages, a DIMM, a method for testing them, and a semiconductor manufacturing method. According to the present invention, there is provided a DRAM stacked package comprising: a plurality of stacked DRAMs; external terminals to which test equipment is connected, said external terminals being used to input/output at least address, command, and data; and an interface chip provided between said plurality of stacked DRAMs and said external terminals. The plurality of DRAMs and the interface chip are implemented on a package. The interface chip comprises: a test circuit including: an algorithmic pattern generator for generating a test pattern used to test the plurality of DRAMs; applying circuits for applying said generated test pattern to the plurality of DRAMs; and a comparator for comparing each response signal received from the plurality of DRAMs with an expected value for judgment.

7 Claims, 14 Drawing Sheets

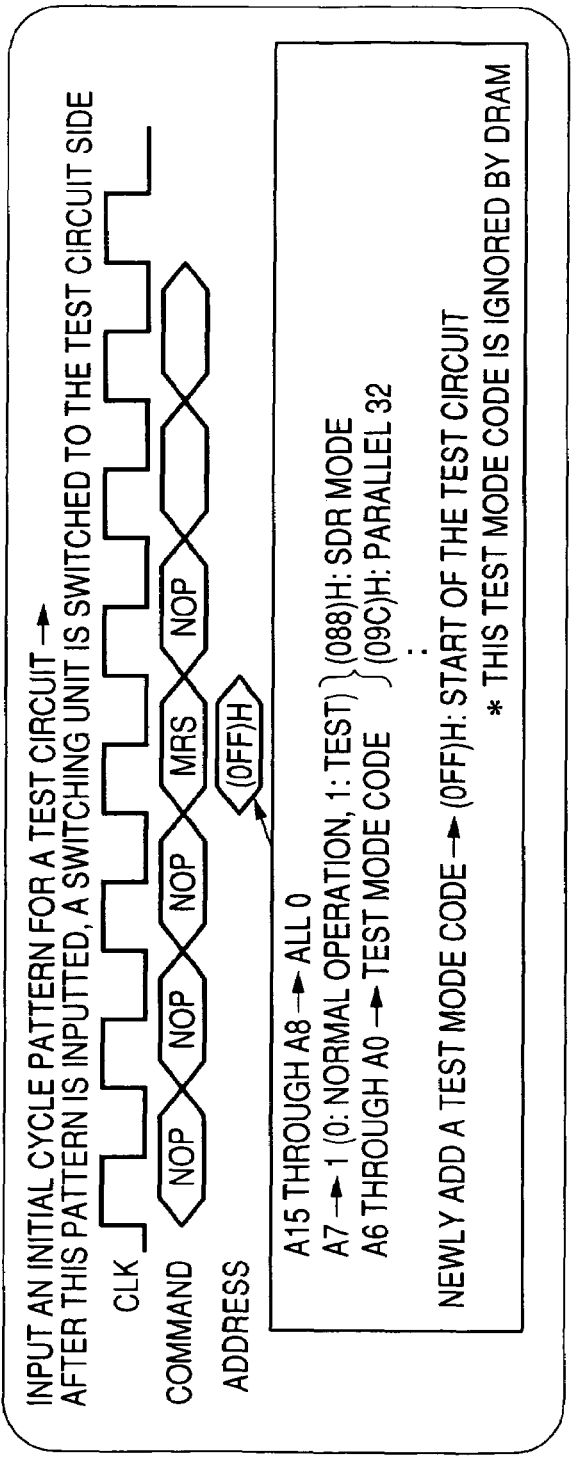
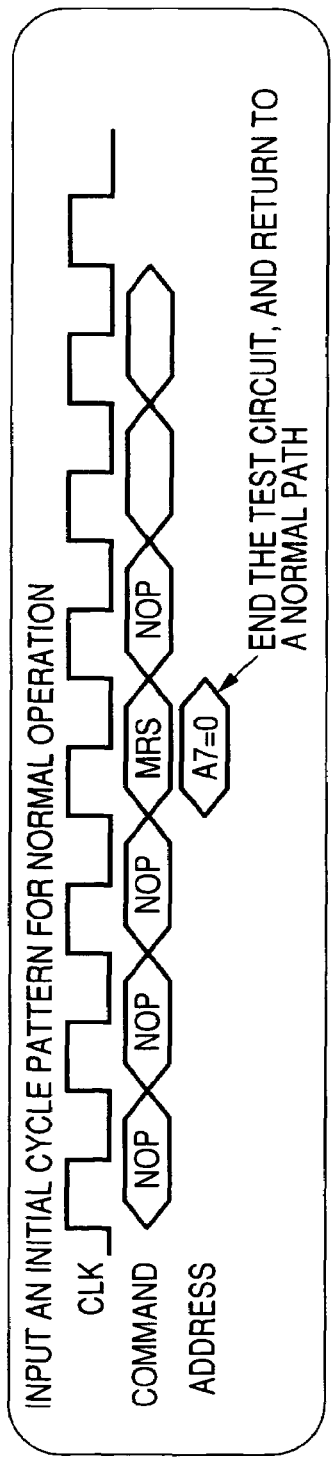
FIG. 6A
FIG. 6B

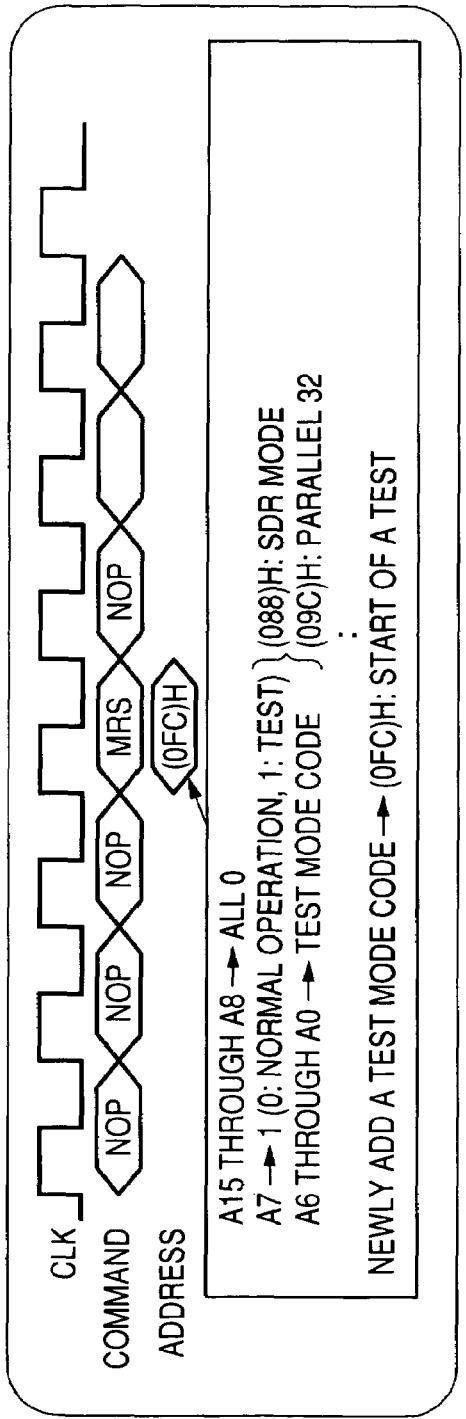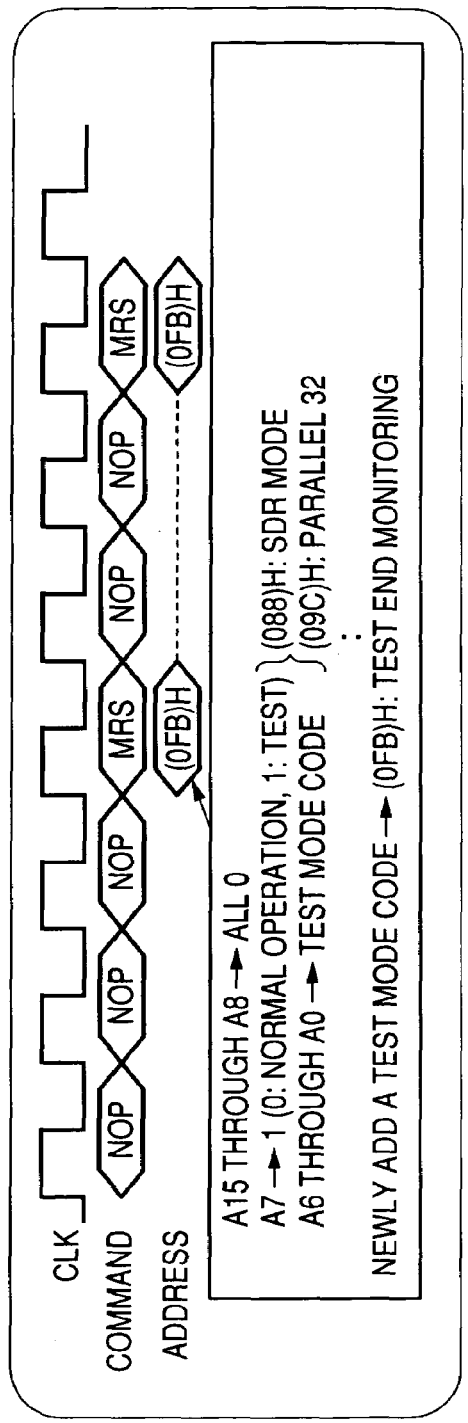

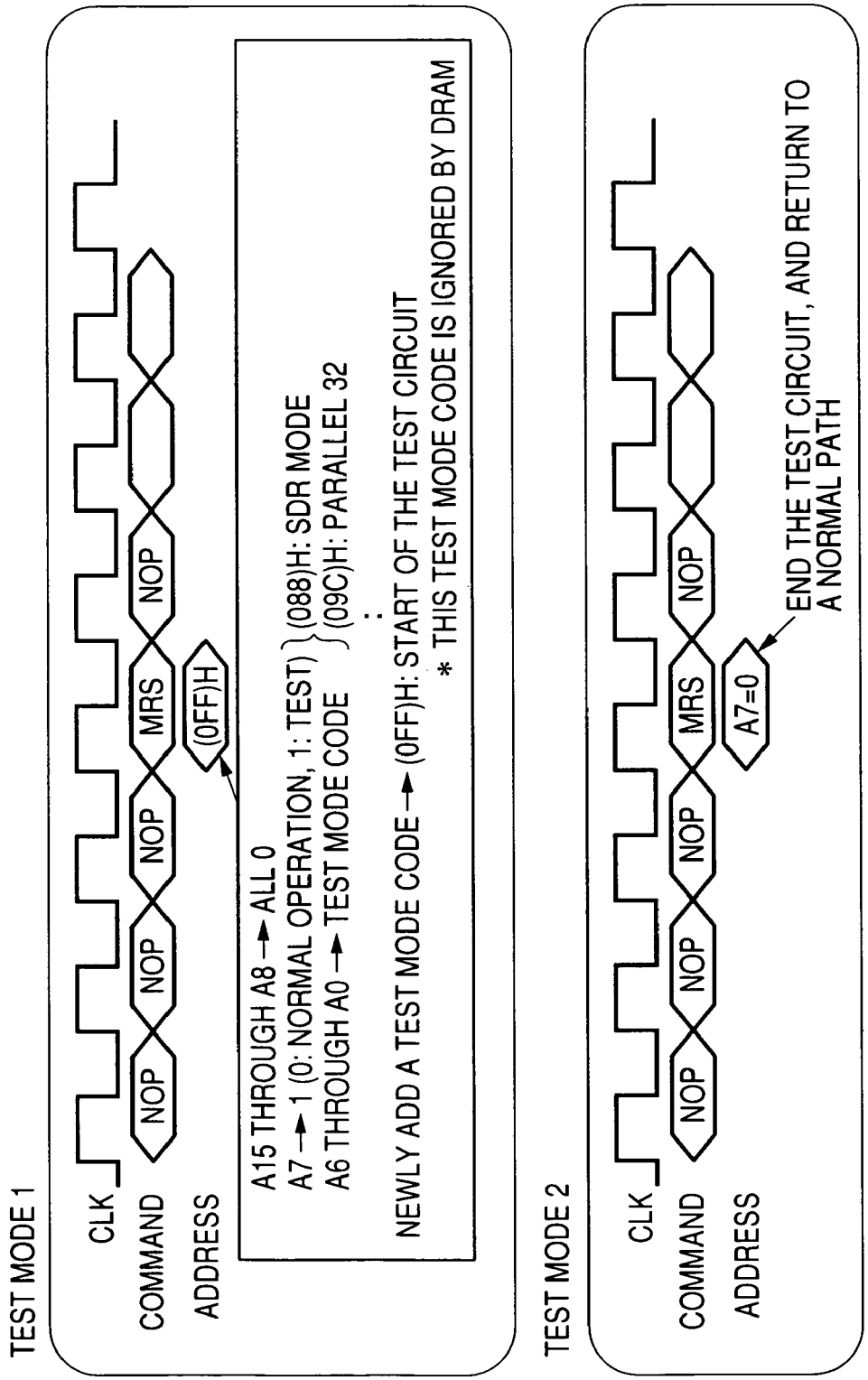

DRAM STACKED PACKAGE, DIMM, AND SEMICONDUCTOR MANUFACTURING METHOD

BACKGROUND OF THE INVENTION

The present invention relates to a DRAM stacked packages, a DIMM, a method for testing them, and a semiconductor manufacturing method.

One of the conventional test methods for testing semiconductor devices is known from Japanese Patent Laid-open No. 2001-35188 (patent document 1). The patent document 1 discloses a method for testing a semiconductor device in which at least three on-chip DRAMs are mounted and each can be independently accessed and at least one of the three DRAMs is different in storage capacity from the other DRAMs. When each of the DRAMs is tested by inputting an independent test address signal into each DRAM, with a DRAM whose test time is the longest being excluded, the other DRAMs (at least two) are serially tested, and in parallel with this serial test, the DRAM whose test time is the longest is tested.

SUMMARY OF THE INVENTION

Along with the speedup of memory I/O, the number of memories which can be connected to a data transmission line decreases. Paying attention to memory I/O whose speed is expected to be 1 Gbps, point-to-point connection is basically used to reduce the influence exerted on the signal quality that is caused by crosstalk or reflection. Therefore, the number of memory slots placed on a motherboard of a PC is only one. For this reason, what is indispensable to memory manufacturers is trying to differentiate themselves from the others with respect to the storage capacity by means of high-density packaging, for example, a stack of DRAM chips.

However, as far as the stack of high-speed DRAMs whose speed is 1 Gbps or more is concerned, external terminals are connected to a DRAM through an interface chip, and the chip which is connected to external terminals of addresses and commands, and to external terminals for data input/output, is configured as one chip. As a result, a frequency used for address, command, and data input/output is increased to the same level as that of a one-chip component. Accordingly, an interface chip is indispensable for interface operation. However, this point is not considered in the above-mentioned prior art.

The present invention has been made to solve the problem, and an object of the present invention is to provide a high-speed DRAM stacked package that can be tested and/or repaired (redundancy-processed) by semiconductor test equipment, a method for testing the DRAM stacked package, a method for repairing (redundancy-processing) the DRAM stacked package, and a semiconductor manufacturing method.

Another object of the present invention is to provide a DIMM whose substrate is equipped with a plurality of DRAM stacked packages, and whose test and/or redundancy processing can be performed, a method for testing the DIMM, a method for repairing (redundancy-processing) the DIMM, and a semiconductor manufacturing method.

In order to achieve the above-mentioned object, according to one aspect of the present invention, there is provided a method for testing a DRAM stacked package. This test method comprises the steps of: providing an interface chip between a plurality of stacked DRAMs and external terminals to which test equipment is connected, the external terminals being used to input/output at least address, command, and data; the plurality of DRAMs and the interface chip are implemented on a package; connecting the test equipment to the external terminals of the package, the external terminals being used to input/output address, command, and data; applying a test pattern used to test the DRAMs, from the test equipment to the external terminals of the package; and testing connections of the address signal lines, the command signal lines, and the data signal lines between the interface chip and the DRAMs, which are included in the package, by comparing each response signal received from the DRAMs in the package with an expected value for judgment.

According to another aspect of the present invention, there is provided a DRAM stacked package comprising:

a plurality of stacked DRAMs;

external terminals to which test equipment is connected, the external terminals being used to input/output at least an address, a command, and data from/to the plurality of DRAMs; and an interface chip provided between the plurality of DRAMs and the external terminals, wherein:

the plurality of DRAMs and the interface chip are implemented on a package; and the interface chip comprises:

a test circuit including:

a test-mode detection circuit for detecting a test mode on the basis of an address and a command inputted from the external terminals;

an algorithmic pattern generator for generating a test pattern used to test the plurality of DRAMs; and an applying circuit for acquiring, as address, command, and data input/output, the test pattern generated by the algorithmic pattern generator; and a switching unit for switching, on the basis of control from the test-mode detection circuit in the test circuit, between a path to the plurality of DRAMs, the path being used for address, command, and data input/output from/to the external terminals, and a path to the plurality of DRAMs, the path being used for address, command, and data input/output from/to the applying circuit in the test circuit.

In addition, according to the present invention, the interface chip comprises:

a test circuit including:

test-mode detection circuit for detecting a test mode on the basis of an address and a command inputted from the external terminals;

an algorithmic pattern generator for generating a test pattern used to test the plurality of DRAMs; and an applying circuit for acquiring, as address, command, and data input/output, the test pattern generated by the algorithmic pattern generator; and a switching unit for switching, on the basis of control from the test-mode detection circuit in the test circuit, between a path to the plurality of DRAMs, the path being used for address, command, and data input/output from/to the external terminals, and a path to the plurality of DRAMs, the path being used for address, command, and data input/output from/to the applying circuit in the test circuit.

In addition, according to the present invention, the interface chip comprises: a test circuit including: an algorithmic pattern generator for generating a test pattern used to test the plurality of DRAMs; an applying circuit for applying, to the plurality of DRAMs, a test pattern generated by the algorithmic pattern generator; a comparator for comparing each response signal received from the plurality of DRAMs with an expected value corresponding to the test pattern for judgment; and a fail address memory, if the comparison made by the comparator results in disagreement, for storing a fail address.

In addition, according to the present invention, the test circuit further comprises: a fail address analysis unit for analyzing the fail address stored in the fail address memory to calculate an address to be relieved; a relief-address insertion unit for inserting the address to be relieved, which has been calculated by the fail address analysis unit, into the test pattern that is used as a redundancy processing pattern generated by the algorithmic pattern generator; and a chip select circuit for applying to the DRAMs a chip selection signal used to select a target DRAM to be repaired (redundancy-processed) from among the plurality of DRAMs.

In addition, according to the present invention, the interface chip comprises: a test circuit including: an algorithmic pattern generator for generating a test pattern used to test the plurality of DRAMs; an applying circuit for applying, to the plurality of DRAMs, a test pattern generated by the algorithmic pattern generator; a comparator for comparing each response signal received from the plurality of DRAMs with an expected value corresponding to the test pattern for judgment; a fail address memory, if the comparison made by the comparator results in disagreement, for storing a fail address; a fail address analysis unit for analyzing the fail address stored in the fail address memory to calculate a relief address; a relief-address insertion unit for inserting the address to be relieved, which has been calculated by the fail address analysis unit, into the test pattern that is used as a redundancy processing pattern generated by the algorithmic pattern generator; and a chip select circuit for applying to the DRAMs a chip selection signal used to select a target DRAM to be repaired (redundancy-processed) from among the plurality of DRAMs.

In addition, according to the present invention, the applying circuit comprises: an output enable circuit for controlling the output of an address and a command received from the relief-address insertion unit; and a redundancy processing enable circuit for controlling the output of data received from the algorithmic pattern generator. In addition, the test circuit comprises: a test-mode detection circuit for detecting a redundancy processing test mode on the basis of an address and a command inputted from the external terminals; and a redundancy processing control unit, when the test-mode detection circuit detects the redundancy processing test mode, for controlling the chip select circuit, the output enable circuit, and the redundancy processing enable circuit depending on whether or not the test pattern used as the redundancy processing pattern is to be applied to the DRAMs.

In addition, according to the present invention, the fail address analysis unit compares the fail address stored in the fail address memory with redundancy processing information acquired from the DRAMs to determine the advisability of redundancy processing; and the algorithmic pattern generator generates the redundancy processing pattern from the result of determining the advisability of redundancy processing, which has been acquired from the fail address analysis unit, and from the address to be relieved, which has been calculated by the fail address analysis unit.

In addition, according to the present invention, the test circuit comprises a test-mode detection circuit for detecting a test mode on the basis of an address and a command inputted from the external terminals; and the interface chip comprises a switching unit for switching, on the basis of control from the test-mode detection circuit, between a path to the plurality of DRAMs, the path being used for address, command, and data input/output from/to the external terminals, and a path to the plurality of DRAMs, the path being used for input/output of an address, a command, and data from/to the applying circuit in the test circuit, the address, command, and data being handled as a test pattern.

According to still another aspect of the present invention, there is provided a DRAM stacked package comprising a plurality of stacked DRAMs; external terminals to which test equipment is connected, the external terminals being used for at least address, command, and data input/output; and an interface chip provided between the plurality of stacked DRAMs and the external terminals. The plurality of DRAMs and the interface chip are implemented on a package. In addition, the interface chip comprises: applying means for applying, to the plurality of DRAMs, a test pattern that is inputted from the test equipment into the external terminals; and a comparator for comparing each response signal received from the plurality of DRAMs with an expected value corresponding to the test pattern so that a judgment is made; and the DRAMs are tested through the interface chip.

According to a further aspect of the present invention, there is provided a DIMM having a substrate equipped with the plurality of DRAM stacked packages.

According to still a further aspect of the present invention, there is provided a DIMM having a substrate equipped with the plurality of DRAM stacked packages. A target DRAM stacked package to be repaired (redundancy-processed) in the DIMM is identified by use of data inputted from external terminals of the DIMM, the external terminals being connected to test equipment.

According to yet another aspect of the present invention, there is provided a semiconductor manufacturing method comprising:

a first manufacturing process for implementing a plurality of stacked DRAMs and an interface chip on a package to manufacture a DRAM stacked package;

a first test process for connecting external terminals of the package to test equipment with the DRAM stacked package manufactured in the first manufacturing process being kept unchanged, then testing operation of the DRAMs through the interface chip, and testing redundancy-process of the DRAMs through the interface chip;

a second manufacturing process for equipping a substrate with the plurality of DRAM stacked packages manufactured in the first manufacturing process so as to manufacture a DIMM; and a second test process for connecting external terminals of the DIMM to the test equipment with the DIMM manufactured in the second manufacturing process being kept unchanged, and then testing operation and redundancy-processing of the DRAMs on a DRAM stacked package basis.

According to the present invention, at least one of the following effects can be achieved.

(1) Test and/or repair (redundancy-process) of a DRAM stacked package become possible.

(2) Test and/or repair (redundancy-process) of a DIMM whose substrate is equipped with a plurality of DRAM stacked packages become possible.

(3) It becomes possible to check connections of address signal lines, command signal lines, and data signal lines between an interface chip and DRAMs by a function test.

(4) Even in the case of a test of a DRAM stacked package, screening inspection and redundancy processing become possible by one and the same equipment.

(5) Even in the case of a test of a DIMM whose substrate is equipped with a plurality of DRAM stacked packages, screening inspection and redundancy processing become possible by one and the same equipment.

(6) By performing the redundancy processing after packaging, it is possible to prevent yields of DRAM stacked packages from falling, which enables a reduction in product price of the DRAM stacked packages.

(7) Even in the case of a DIMM whose substrate is equipped with a plurality of DRAM stacked packages, performing the redundancy processing after DIMM assembling makes it possible to prevent yields of DIMMs from falling, which enables a reduction in product price of the DIMMs.

BRIEF DESCRIPTION OF THE DRAWINGS

FIGS. 6A and 6B are diagrams each illustrating a first embodiment of a control method for controlling a test circuit according to the present invention, FIG. 6A illustrating a test mode for starting the test circuit, and FIG. 6B illustrating a test mode for ending the test circuit;

FIGS. 8A and 8B are diagrams each illustrating a third embodiment of a control method for controlling a test circuit according to the present invention, FIG. 8A illustrating a test mode for starting a test, and FIG. 8B illustrating a test mode for ending a test;

FIG. 14 is a diagram illustrating an example of how to fill a data sheet of a test mode for controlling a test circuit according to the present invention.

BEST MODES FOR CARRYING OUT THE INVENTION

Embodiments of the present invention will be described with reference to the drawings as below. The embodiments relate to a DRAM stacked package, a test method for testing the DRAM stacked package, a DIMM (Dual in-line Memory Module) whose substrate is equipped with a plurality of DRAM stacked packages, a test method for testing the DIMM, and a semiconductor manufacturing method according to the present invention.

First Embodiment

A method for testing a DRAM stacked package according to a first embodiment of the present invention will be described below.

First of all, a test method incorporating a function test according to the first embodiment of the present invention will be described with reference to FIGS. 1 through 4. The function test is used to test connections (connection pattern) of address signal lines, command signal lines, and data signal lines between an interface chip and DRAMs included in a DRAM stacked package.

Figure 1:
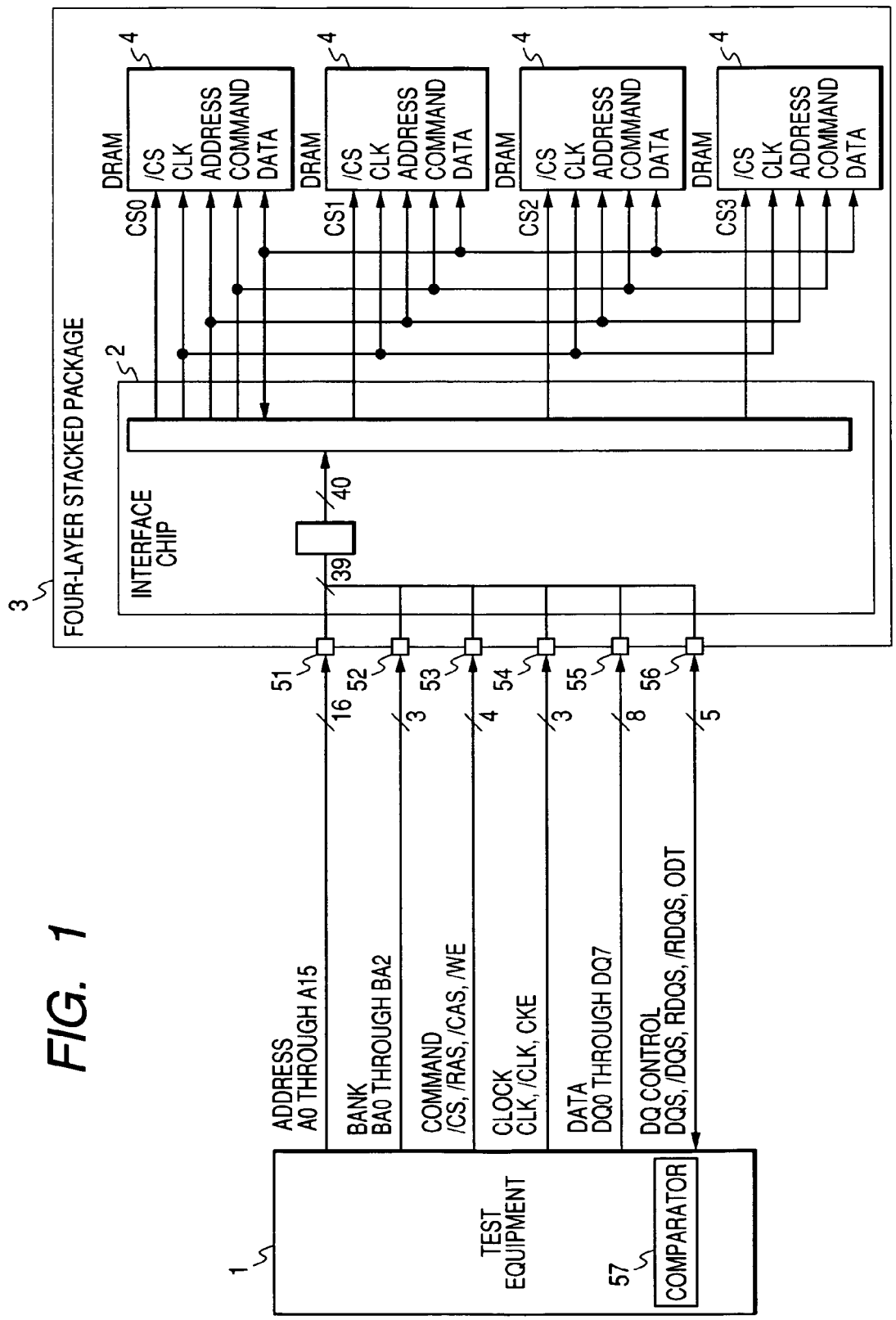
FIG. 1 is a diagram schematically illustrating a configuration of a test performed when a DRAM stacked package according to the present invention is, for example, a four-layer stacked package.

FIG. 1 is a diagram schematically illustrating a configuration of a test performed when a DRAM stacked package 3 is, for example, a four-layer stacked package. The DRAM stacked package 3 according to the present invention is configured as one package comprising: a stacked chip including a plurality of DRAMs 4; and an interface chip 2 connected to external terminals connected to test equipment 1. The test equipment 1 is connected to the external terminals 51 through 56 used to input/output an address, a command, and data of the DRAM stacked package (for example, four-layer stacked package) 3. A test pattern used to test the DRAMs 4 is applied from the test equipment 1 to the external terminals 51 through 56 of the package, and is then applied from the interface chip 2 to the DRAMs 4 in the package. After that, each response signal from the DRAMs 4 is compared with an expected value based on the test pattern by a comparator 57 to test connections (connection pattern) of address signal lines, command signal lines, and data signal lines between the interface chip 2 and the DRAMs 4 in the package. In this case, to test connections between the interface chip 2 and the DRAMs 4, checking in low-speed operation suffices.

First, second, and third embodiments of a connection test method will be below described with reference to FIGS. 2A and 2B, 3A and 3B, and 4, respectively.

Figure 2A:
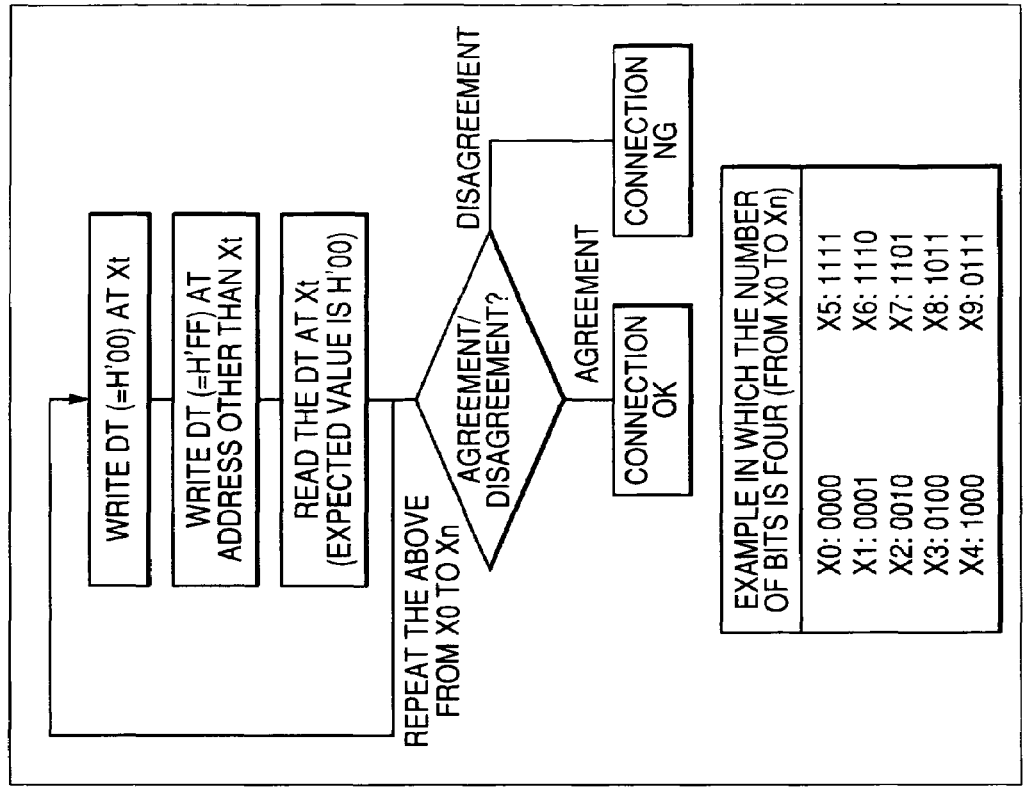
FIGS. 2A and 2B are flowcharts each illustrating a connection test method incorporating a function test according to a first embodiment of the present invention, FIG. 2A illustrating a connection test method for testing data bits, and FIG. 2B illustrating a connection test method for testing address bits.
Figure 2B:
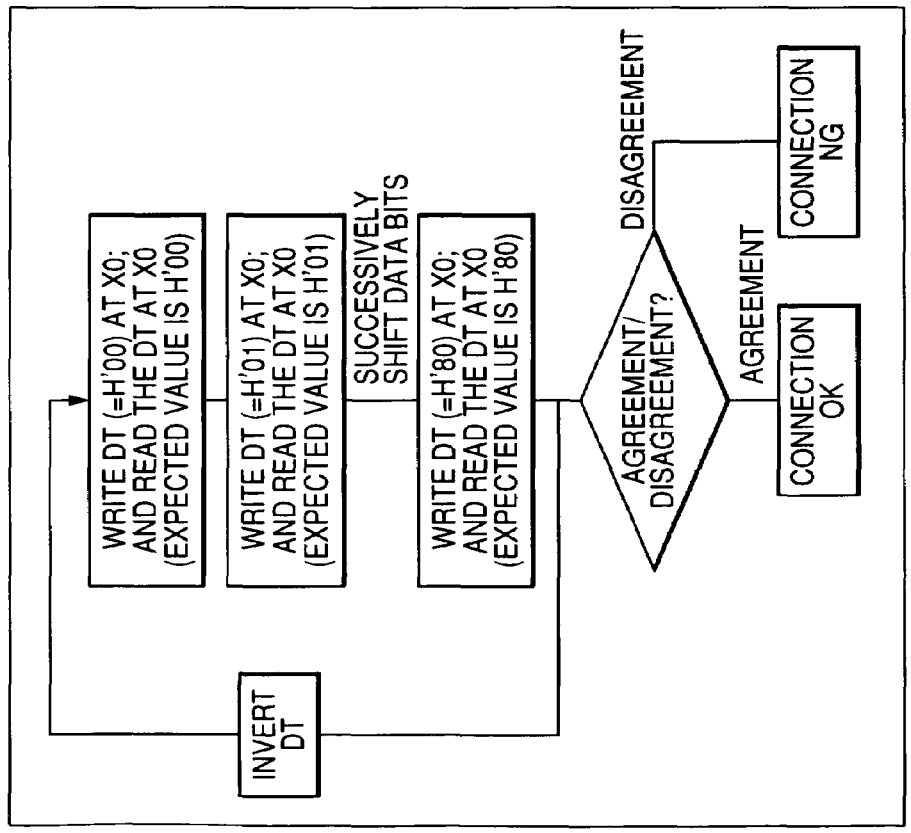

FIGS. 2A and 2B are flowcharts each illustrating a connection test method incorporating a function test used in semiconductor test equipment according to the first embodiment of the present invention. FIG. 2A illustrates a connection test method for testing data bits; and FIG. 2B illustrates a connection test method for testing address bits.

In a connection test of data bits, data H'00 (hexadecimal number) is written at an address X0, and then the data is read at the address X0. Next, data H'01 (hexadecimal number) is written at an address X0, and then the data is read at the address X0. Thereafter, a value obtained by shifting the data bits is successively written at the address X0 before reading the value at the address X0. If the data becomes H'80 (hexadecimal number), which is the bit width of the data, the data is inverted, and then steps which are the same as above are repeated. By applying such a test pattern from the test equipment 1 to the external terminals 51, 53 of the package, the test pattern is applied to the DRAM in the package through the interface chip 2. Then, a response signal from the DRAM 4 (reading at the address X0) is compared with an expected value (H'00 through H'80) by the comparator 57. If the response signal coincides with the expected value, it is judged to be connection OK. On the other hand, if the response signal does not coincide with the expected value, it is judged to be connection NG.

In a connection test of address bits, data H'00 (hexadecimal number) is written at the address X0, and data H'FF (hexadecimal number) is written at addresses other than the address X0, and then the data is read at the address X0. Next, data H'00 (hexadecimal number) is written at the address X1, and data H'FF (hexadecimal number) is written at addresses other than the address X1, and then the data is read at the address X1. Thereafter, steps which are the same as above are repeated from X2 to Xn. By applying such a test pattern from the test equipment 1 to the external terminals 51, 53 of the package, the test pattern is applied to the DRAM in the package through the interface chip 2. Then, a response signal from the DRAM 4 in the package (reading at addresses Xt=X0 through Xn) is compared with an expected value (H'00) by the comparator 57. If the response signal coincides with the expected value, the connection is judged to be connection OK. On the other hand, if the response signal does not coincide with the expected value, the connection is judged to be connection NG.

Figure 3B:
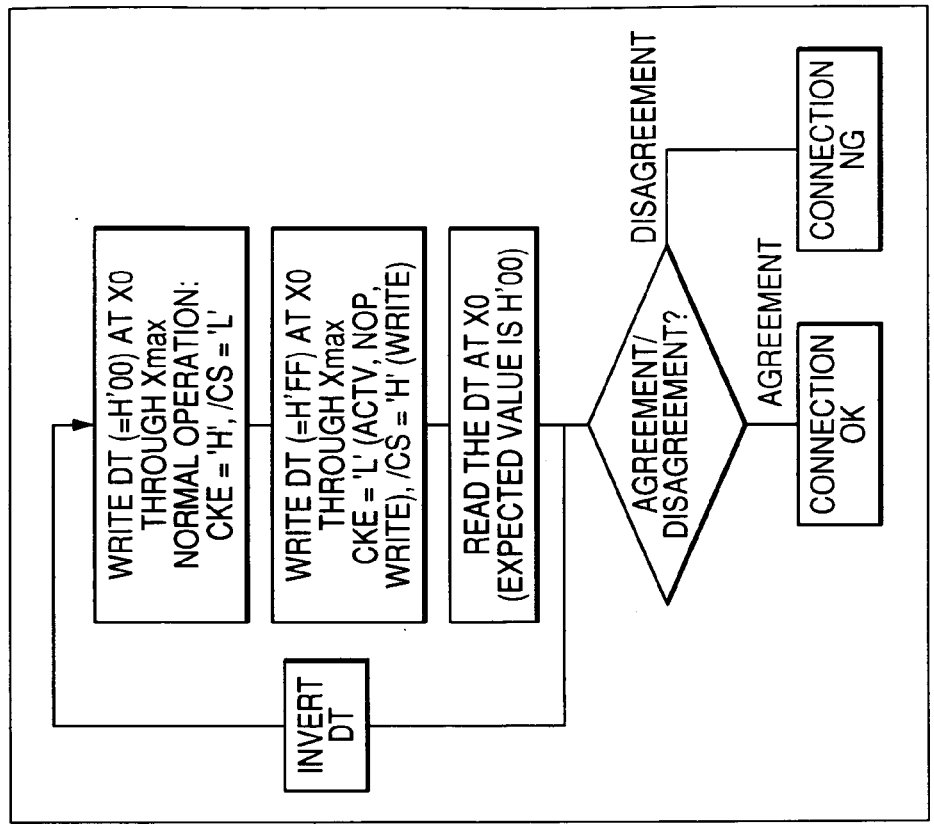
FIGS. 3A and 3B are flowcharts each illustrating a connection test method incorporating a function test according to a second embodiment of the present invention, FIG. 3A illustrating a connection test method for testing command bits (/RAS, /CAS, /WE), and FIG. 3B illustrating a connection test method for testing command bits (/CS) and a clock address (CKE)
Figure 3A:
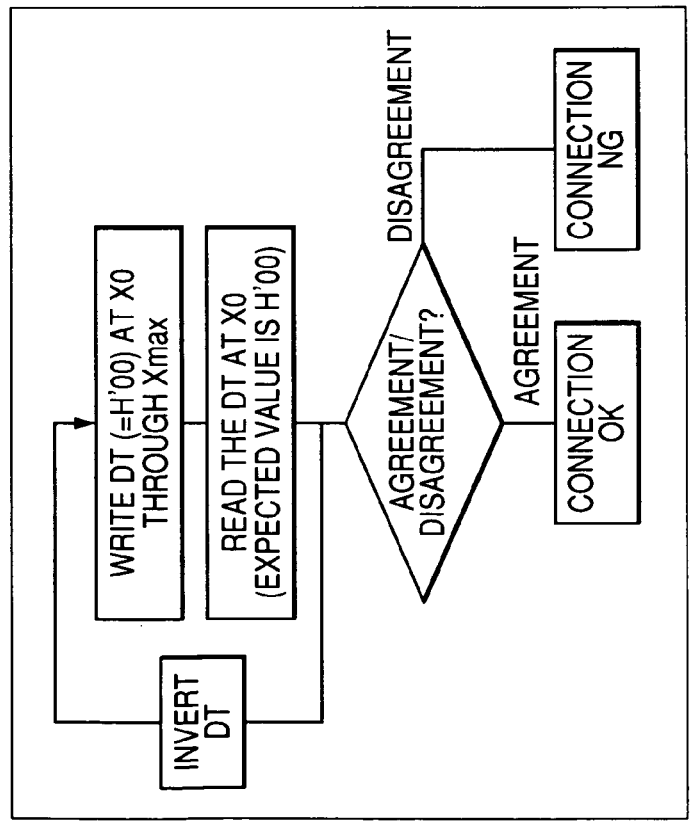

FIGS. 3A and 3B are flowcharts each illustrating a connection test method incorporating a function test used in semiconductor test equipment according to the second embodiment of the present invention. FIG. 3A illustrates a connection test method for testing command bits (/RAS, /CAS, /WE); and FIG. 3B illustrates a connection test method for testing command bits (/CS) and a clock (CKE).

In a connection test of the command bits (/RAS, /CAS, /WE), data H'00 (hexadecimal number) is written at addresses X0 through Xmax, and then the data is read at the address X0. Next, the data is inverted, and the inverted data is written at the addresses X0 through Xmax, and then the data is read at the address X0. By applying such a test pattern from the test equipment 1 to the external terminals 51 through 53 of the package, the test pattern is applied to the DRAM in the package through the interface chip 2. Then, a response signal from the DRAM 4 in the package (reading at address X0) is compared with an expected value (H'00) by the comparator 57. If the response signal coincides with the expected value, the connection is judged to be connection OK. On the other hand, if the response signal does not coincide with the expected value, the connection is judged to be connection NG. Consequently, the result of the judgment (judgment result) is output from the interface chip 2 to the test equipment 1.

In a connection test of the command bits (/CS) and the clock (CKE), data H'00 (hexadecimal number) is written at the addresses X0 through Xmax, and then data H'FF (hexadecimal number) is written at the addresses X0 through Xmax. Next, the data is read at the address X0. After that, the data is inverted, and steps which are the same as above are repeated. By applying such a test pattern from the test equipment 1 to the external terminals 51 through 54 of the package, the test pattern is applied to the DRAM in the package through the interface chip 2. Then, a response signal from the DRAM 4 in the package (reading at the address X0) is compared with an expected value (H'00) by the comparator 57. If the response signal coincides with the expected value, the connection is judged to be connection OK. On the other hand, if the response signal does not coincide with the expected value, the connection is judged to be connection NG. The connection test of the command bits can basically check the connections as long as control (ACTV, NOP, READ, WRITE, and the like) in other tests functions.

Figure 4:
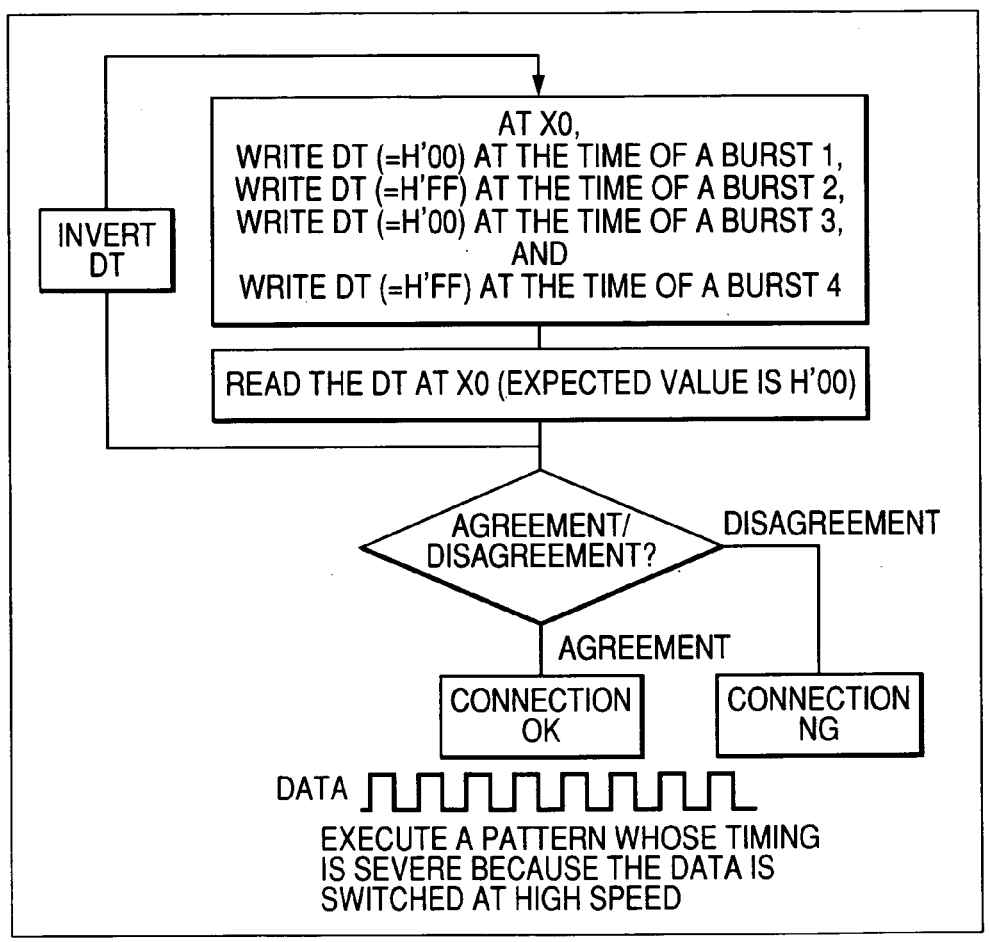
FIG. 4 is a flowchart illustrating a connection test method incorporating a function test according to a third embodiment of the present invention, and illustrating a connection test method for testing connections of clock (/CLK) and control (/DQS, RDQS, /RDQS)

FIG. 4 is a flowchart illustrating a connection test method incorporating a function test used for semiconductor test equipment according to the third embodiment of the present invention. More specifically, FIG. 4 illustrates how to perform a connection test of clock (/CLK) and DQ control (/DQS, RDQS, /RDQS).

In the connection test of the clock (/CLK) and the DQ control (/DQS, RDQS, /RDQS), data is written at an address X0, and is then read at the address X0, on a burst basis. To be more specific, at the time of a burst 1, data H'00 (hexadecimal number) is written at the address X0 before the data is read at the address X0; and thereafter, at the time of burst 2, 3, 4, data H'FF, H'00, H'FF (hexadecimal number) is written at the address X0 respectively, before each data is read at the address X0. After that, the data is inverted, and steps which are the same as above are repeated. Thus, a pattern whose timing is severe because the data is switched at high speed is applied from the test equipment 1 to the external terminals 51 through 54 of the package. As a result, the pattern is applied to the DRAMs in the package through the interface chip 2. Then, a response signal from the DRAM 4 in the package (reading at the address X0) is compared with an expected value (H'00) by the comparator 57. If the response signal coincides with the expected value, the connection is judged to be connection OK. On the other hand, if the response signal does not coincide with the expected value, the connection is judged to be connection NG.

As a result of the processing described above, a function test makes it possible to perform a connection test (test of a connection pattern) of address signal lines, command signal lines, and data signal lines between the interface chip 2 and the plurality of DRAMs 4.

Next, one embodiment of a method for testing a DRAM stacked package (for example, a four-layer stacked package) through the interface chip 2 will be specifically described with reference to FIGS. 5 through 9.

Figure 5:
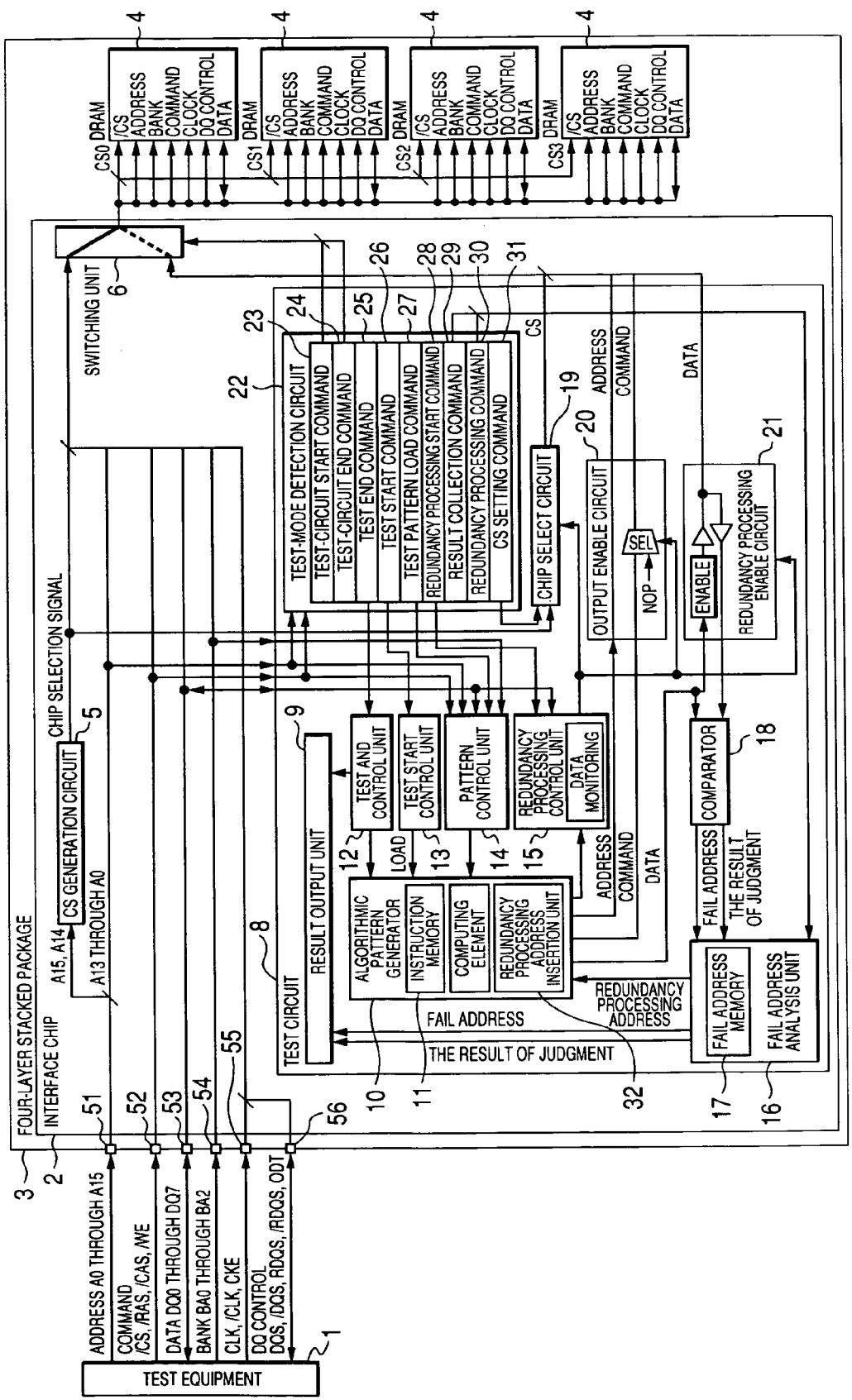
FIG. 5 is a diagram illustrating a configuration of an interface chip included in a DRAM stacked package according to one embodiment of the present invention.

FIG. 5 is a diagram illustrating a configuration of the interface chip 2 that is indispensable to test and/or repair (redundancy-process) of a stacked package including high-speed DRAMs each having a speed of 1 Gbps according to one embodiment of the present invention. The interface chip 2 according to the present invention comprises: a CS generation circuit 5 for decoding part (A15, A14) of address bits from a package external terminal 51 to generate a chip selection signal; a test circuit 8; and a switching unit 6 for switching between a path for address, command, and data input/output from/to the package external terminals 51 through 56, and a path for address, command, and data input/output from/to the test circuit 8, by a test-circuit start command 23 or a test-circuit end command 24 received from a test-mode detection circuit 22 included in the test circuit 8. The test circuit 8 comprises: the test-mode detection circuit 22; a chip select circuit 19; a test start control unit 13; a test end control unit 12; a pattern control unit 14; an algorithmic pattern generator 10; a comparator 18; a fail address memory 17; and a result output unit 9. The test-mode detection circuit 22 detects a test mode by the addresses (A13 through A0) and the commands (/CS, /RAS, /CAS, /WE) received from the package external terminals 51, 52. The chip select circuit 19 controls chip select of a DRAM by use of a chip selection signal received from the CS generation circuit 5 and a CS setting command 31 received from the test-mode detection circuit 22. The test start control unit 13 controls starting of a test by a test start command 26 received from the test-mode detection circuit 22. The test end control unit 12 controls ending of the test by a test end command 25 received from the test-mode detection circuit 22. The pattern control unit 14 controls writing of a test pattern (data) in response to an address and a command transmitted from the test equipment 1 to an instruction memory 11 by a test pattern load command 27 received from the test-mode detection circuit 22. The algorithmic pattern generator 10 generates a test pattern used to test the DRAM 4, and applies (gives) the test pattern to the DRAM 4. The comparator 18 compares a response signal from the DRAM 4 with an expected value corresponding to the test pattern. The fail address memory 17 is adapted to store a fail address therein if the comparison results in disagreement. The result output unit 9, in response to the end of a test controlled by the test end control unit 12 and a result collection command 29 received from the test-mode detection circuit 22, outputs a fail address, and the result of judgment, received from a fail address analysis unit 16 to the test equipment 1 through the external terminal 53 of the package using a data signal.

The configuration and operation of the interface chip 2 will be described below. When the DRAM 4 is tested, the test-circuit start command 23 is first executed in a test mode that uses an address and a command. Next, the test-mode detection circuit 22 identifies the test mode, and then switches the switching unit 6 to the test circuit side. After that, the test pattern load command 27 is executed in a test mode that uses an address and a command. The test-mode detection circuit 22 identifies the test mode, and then writes to the instruction memory 11 the test pattern inputted from the test equipment 1 under the control of the pattern control unit 14. After that, the test start command 26 is executed in a test mode that uses an address and a command. The test-mode detection circuit 22 identifies the test mode, and then a test is started under the control of the test start control unit 13. The test pattern includes regular addresses corresponding to the test order, test data to be written to the DRAM 4, and a control signal used to perform write/read operation. The test pattern is applied from the algorithmic pattern generator 10 to the DRAM 4. First of all, data of '1' or '0' and a write control signal (write command) are applied at one arbitrary address to perform a write to the DRAM 4. Next, if a read control signal (read command) is applied at the one address at which the write has been performed, data (response signal) is output from the DRAM 4. Accordingly, this data (response signal) is read out. The comparator 18 then compares the data with previously written data (expected value) to judge whether or not both data coincide with each other. By performing the above processing for all addresses of the DRAMs 4, a judgment is made as to whether each DRAM 4 is good or bad (agreement/disagreement). As a result of the processing described above, it becomes possible to perform a test of the four-layer stacked package through the interface chip 2.

The test end command 25 is executed in a test mode that uses an address and a command. The test-mode detection circuit 22 then identifies the test mode. The test end control unit 12 monitors the instruction memory 11 at specified intervals of time by inputting the test mode. If detecting the end of the test, the test end control unit 12 notifies the result output unit 9 of the end. Then, the result output unit 9 outputs the result to the package external terminal 53 through the data line. The test-circuit end command 24 is executed in a test mode that uses an address and a command. The test-mode detection circuit 22 identifies the test mode, and then switches the switching unit 6 to the external terminal side of the package.

The result collection command 29 is executed in a test mode that uses an address and a command. The test-mode detection circuit 22 identifies the test mode, and then transmits to the result output unit 9 a fail address and the judgment result that are stored in the fail address memory 17. The result output unit 9 outputs them to the package external terminal 53 through the data line. The above configuration and operation make it possible to perform a test of the DRAM stacked package 3 through the interface chip 2.

Next, a method for controlling the test circuit 8 will be described with reference to FIGS. 6A through 9.

FIGS. 6A and 6B are diagrams each illustrating a first embodiment of a method for controlling the test circuit 8. FIG. 6A is a diagram illustrating a test mode for the test-circuit start command 23; FIG. 6B is a diagram illustrating a test mode for the test-circuit end command 24.

The test-circuit start command 23 is executed in a test mode that uses an address and a command. Here, an address at the time of a MRS (Mode Register Set) command is assumed to be, for example, (0FF)H that means starting of a test circuit. This address is newly added as a test mode code (for example, (0FF)H). The test-mode detection circuit 22 judges from the address and the command that a test mode is the start of the test circuit. Then, the test circuit 8 is controlled. As a result of inputting this test mode, the switching unit 6 is switched to the test circuit side.

The test-circuit end command 24 is executed in a test mode that uses an address and a command. Here, an address at the time of an MRS command (for example, the address A7) is assumed to be '0' that means the end of the test circuit. The test-mode detection circuit 22 judges from the address and the command that a test mode is the end of the test circuit. Then, the test circuit 8 is controlled. As a result of inputting this test mode, the switching unit 6 is switched to the external terminal side of the package.

Figure 7:
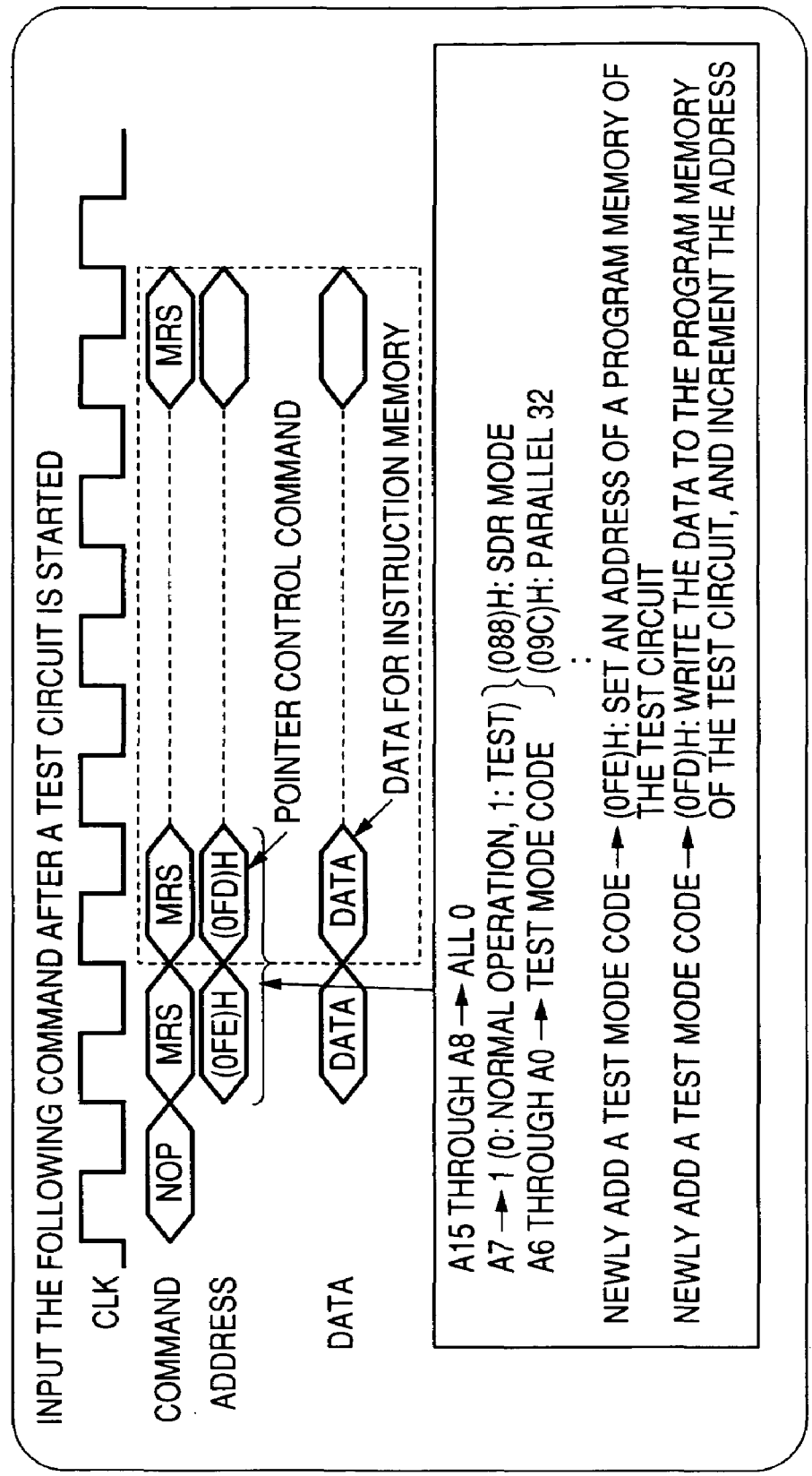
FIG. 7 is a diagram illustrating a test mode for loading a test pattern, which is a second embodiment of a control method for controlling a test circuit according to the present invention.

FIG. 7 is a diagram illustrating a second embodiment of a method for controlling the test circuit 8, and illustrating a test mode for the test pattern load command 27 that loads a test pattern into the test circuit 8. The test pattern load command 27 which loads a test pattern into the test circuit 8 is executed in a test mode that uses an address, a command, and data. Here, an address at the time of a MRS command is assumed to be, for example, (0FE)H that means address settings of the instruction memory of the test circuit 8. An address at the time of the next MRS command is assumed to be (0FD)H meaning that data (test pattern) is written to the instruction memory 11 of the test circuit 8, and then the address is incremented. The data to be written to the instruction memory 11 is data (DQ0 through DQ7) received from the test equipment 1 at this time. This address is newly added as a test mode code (for example, (0FE)H, (0FD)H). The test-mode detection circuit 22 judges from the address and the command that a test mode is the test pattern load into the test circuit. Then, the pattern control unit 14 of the test circuit 8 is controlled. As a result of inputting this test mode, the test pattern is written to the instruction memory.

FIGS. 8A and 8B are diagrams each illustrating a third embodiment of a method for controlling the test circuit 8.

FIG. 8A is a diagram illustrating a test mode for the test start command 26; FIG. 8B is a diagram illustrating a test mode for the test end command 25.

The test start command 26 is executed in a test mode that uses an address and a command. Here, an address at the time of a MRS (Mode Register Set) command is assumed to be, for example, (0FC)H that means starting of a test. This address is newly added as a test mode code (for example, (0FC)H). The test-mode detection circuit 22 judges from the address and the command that a test mode is the test start. Then, the test start control unit 13 of the test circuit 8 is controlled. As a result of inputting this test mode, the test start control unit 13 starts the test.

The test end command 25 is executed in a test mode that uses an address and a command. Here, an address at the time of a MRS command is assumed to be, for example, (0FB)H that means the end of a test. The command is executed at this address at specified intervals of time. This address is newly added as a test mode code (for example, (0FB)H). The test-mode detection circuit 22 judges from the address and the command that a test mode is the test end. Then, the test end control unit 12 of the test circuit 8 is controlled. As a result of inputting this test mode, the test end control unit 12 monitors the instruction memory 11 at intervals of time determined by the test mode to detect the test end, and outputs the result to the result output unit 9.

Figure 9:
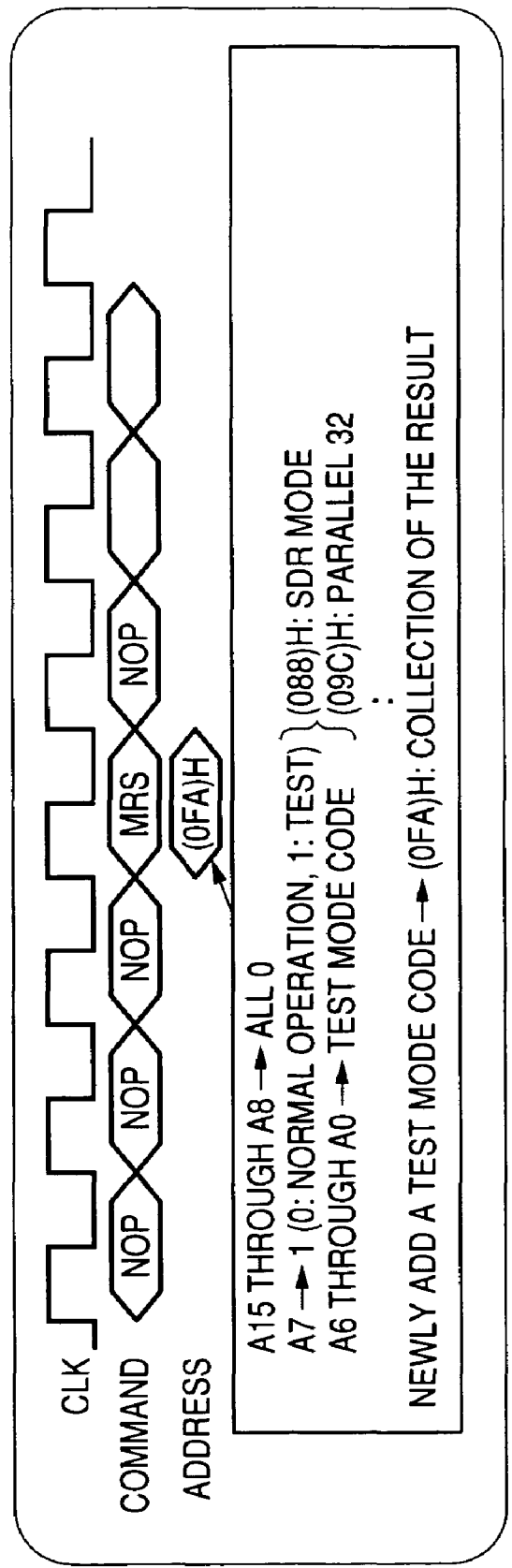
FIG. 9 is a diagram illustrating a test mode for collecting the result, which is a fourth embodiment of a control method for controlling a test circuit according to the present invention.

FIG. 9 is a diagram illustrating a fourth embodiment of a method for controlling the test circuit 8, and illustrating a test mode for the result collection command 29. The result collection command 29 is executed in a test mode that uses an address and a command. Here, an address at the time of a MRS command is assumed to be, for example, (0FA)H that means the collection of the result. This address is newly added as a test mode code (for example, (0FA)H). The test-mode detection circuit 22 judges from the address and the command that a test mode is the result collection. Then, the fail address analysis unit 16 of the test circuit 8 is controlled. As a result of inputting this test mode, the fail address analysis unit 16 outputs a fail address and the judgment result to the result output unit 9.

Next, a method for repairing (redundancy-processing) a DRAM stacked package through the interface chip 2 according to the first embodiment of the present invention will be described with reference to FIGS. 5, 10A, 10B and 11.

As shown in FIG. 5, the interface chip 2 according to the present invention is further configured to execute a method for repairing (redundancy-processing) a DRAM stack package. That is to say, the interface chip 2 further comprises: a fail address memory 17; a fail address analysis unit 16; a relief-address insertion unit 32; a chip select circuit 19; an output enable circuit 20; a redundancy processing enable circuit 21; and a redundancy processing control unit 15. The fail address memory 17 is adapted to store a fail address therein if the comparison by the comparator 18 results in disagreement. The fail address analysis unit 16 analyzes a fail address, which is stored in the fail address memory by a redundancy processing command 30 received from the test-mode detection circuit 22, and calculates a relief address. The relief-address insertion unit 32 inserts into a test pattern (a redundancy processing pattern) an address to be relieved, and applies the test pattern to the DRAMs 4. The chip select circuit 19 uses a chip selection signal received from the CS generation circuit 5 and the CS setting command 31 received from the test-mode detection circuit 22 to control chip select by which the redundancy processing pattern is applied. The output enable circuit 20 controls the output of an address and a command of a redundancy processing pattern that is obtained from the relief-address insertion unit 32 of the algorithmic pattern generator 10. The redundancy processing enable circuit 21 controls the output of redundancy processing pattern data generated by the algorithmic pattern generator 10. The redundancy processing control unit 15 controls the chip select circuit 19, the output enable circuit 20, and the redundancy processing enable circuit 21 so that the redundancy processing pattern generated by the algorithmic pattern generator 10 can be applied to the DRAM by a redundancy processing start command 28 received from the test-mode detection circuit 22.

The configuration and operation of the interface chip 2 described above will be described below.

When the DRAMs 4 are tested and repaired (redundancy processed), the test-circuit start command 23 is first executed in a test mode that uses an address and a command. Next, the test-mode detection circuit 22 identifies the test mode, and then switches the switching unit 6 to the test circuit side. After that, the test pattern load command 27 is executed in a test mode that uses an address and a command. The test-mode detection circuit 22 identifies the test mode, and then writes a test pattern to the instruction memory 11 under the control of the pattern control unit 14. After that, the test start command 26 is executed in a test mode that uses an address, and a command. The test-mode detection circuit 22 identifies the test mode, and then a test is started under the control of the test start control unit 13. Next, on the basis of regular addresses corresponding to the test order, test data to be written to the DRAM 4, and a control signal used to perform write/read operation, the test pattern is applied to the DRAM 4 from the algorithmic pattern generator 11. First of all, data of '1' or '0' and a write control signal (write command) are applied at one arbitrary address to perform a write to the DRAM 4. Next, if a read control signal (read command) is applied at the one address at which the write has been performed, data (response signal) is output from the DRAM 4. Accordingly, this data (response signal) is read out. The comparator 18 then compares the data with previously written data (expected value) to judge whether or not both data coincide with each other. By performing the above processing for all addresses of the DRAMs 4, a judgment is made as to whether each DRAM 4 is good or bad (agreement/disagreement).

Here, if the comparison results in disagreement at even one address, the DRAM 4 is usually judged to be a defective unit. However, if redundancy processing for preventing a decrease in yields is performed, a value of a fail address is stored in the fail address memory 17. When the redundancy processing is performed on the basis of the fail address value, the redundancy processing command 30 is first executed in a test mode that uses an address, and a command. Then, the test-mode detection circuit 22 identifies the test mode, and transmits the redundancy processing command 30 to the fail address analysis unit 16. On the basis of the fail address value, the fail address analysis unit 16 determines an address that should be actually relieved, and then makes a comparison with redundancy processing information (information as to whether or not a defect cell can be switched to a redundant cell to perform the redundancy processing) read out from the DRAM 4 so as to determine advisability of redundancy processing. On the basis of the result of determining the advisability of redundancy processing and a relief address that are output from the fail address analysis unit 16, the algorithmic pattern generator 10 generates a redundancy processing pattern to be applied to the DRAM 4. Then, the relief-address insertion unit 32 inserts the address to be relieved into the test pattern (redundancy processing pattern). The redundancy processing start command 28 is executed in a test mode that uses an address and a command. The test-mode detection circuit 22 then identifies the test mode, and transmits the redundancy processing start command 28 to the redundancy processing control unit 15. On the basis of a redundancy processing control signal received from the algorithmic pattern generator 10 and the redundancy processing start command 28 received from the test-mode detection circuit 22, the redundancy processing control unit 15 judges whether or not to apply the redundancy processing pattern to the DRAM 4. If it is judged that the redundancy processing pattern should be applied to the DRAM 4, a chip selection signal is output from the chip select circuit 19, an address and a command are output from the output enable circuit 20, and data is output from the redundancy processing enable circuit 21, before they are applied to the DRAM 4.

Next, how to read redundancy processing information and how to perform the redundancy processing will be described. When the redundancy processing information is read out, one DRAM in the four-layer stacked package 3 is first selected according to a chip selection signal by addresses A15, A14. Next, a pattern for entering a test mode is applied to the DRAM 4 from the test equipment 1 through the interface chip 2. As a result of applying the test mode entry pattern to the DRAM 4, a redundancy processing circuit (not illustrated) of the DRAM 4 is activated, which causes the switching unit 6 to start the test mode. Next, when a command for reading out the redundancy processing information from the output enable circuit 20 is applied, the redundancy processing information is output from the DRAM 4. The above processing is performed for all of the four DRAMs 4 included in the DRAM stacked package 3 and the fail address analysis unit 16 determines the advisability of redundancy processing of the four DRAMs 4.

When the redundancy processing is performed, a target DRAM to be repaired (redundancy-processed) is first selected from among the DRAMs included in the DRAM stacked package (four-layer stacked package) 3 according to a chip selection signal by the addresses A15, A14. Next, a pattern for entering a test mode is applied to the DRAM 4 from the test equipment 1 through the interface chip 2. As a result of applying the test mode entry pattern to the DRAM 4, a redundancy processing circuit (not illustrated) is activated, which causes the switching unit 6 to switch to the test mode. Next, when a command for redundancy processing and an address to be relieved are applied from the algorithmic pattern generator 10 through the output enable circuit 20, the redundancy processing circuit (not illustrated) which is built into the DRAM 4 replaces a defective cell with a redundant cell for the redundancy processing.

The test end command 25 is executed in a test mode that uses an address and a command. The test-mode detection circuit 22 then identifies the test mode. The test end control unit 12 monitors the instruction memory 11 at specified intervals of time by inputting the test mode. If detecting the end of the test, the test end control unit 12 notifies the result output unit 9 of the end. Then, the result output unit 9 outputs the result to the external terminals of the package through the data lines. The test-circuit end command 24 is executed in a test mode that uses an address and a command. The test-mode detection circuit 22 identifies the test mode, and then switches the switching unit 6 to the external terminal side of the package.

The above-mentioned configuration makes it possible to repair (redundancy-process) the DRAM stacked package 3 through the interface chip 2.

Next, a method for controlling a test circuit at the time of executing redundancy processing will be described with reference to FIGS. 10A, 10B and 11.

Figure 10A:
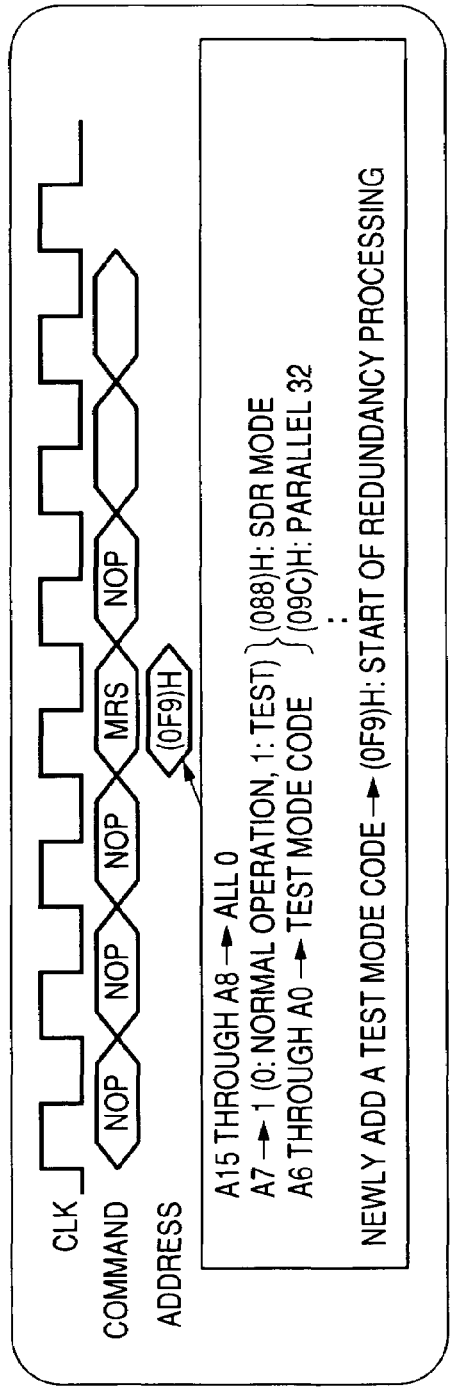
FIGS. 10A and 10B are diagrams each illustrating a first embodiment of a control method for controlling a test circuit at the time of performing redundancy processing according to the present invention, FIG. 10 (a) illustrating a test mode for starting the redundancy processing, and FIG. 10 (b) illustrating a test mode for the redundancy processing.
Figure 10B:
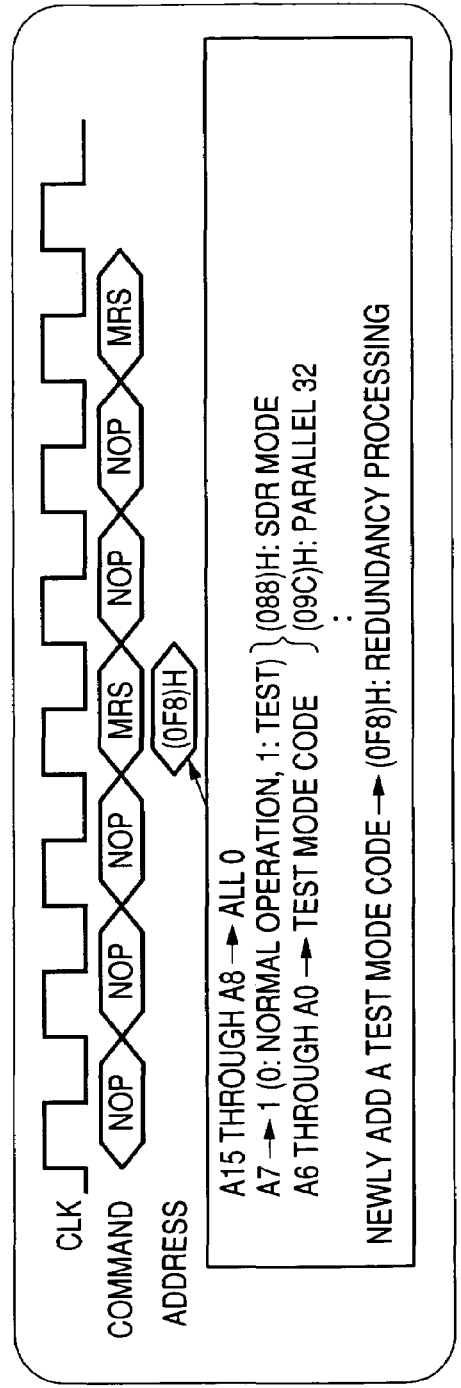

FIGS. 10A and 10B are diagrams each illustrating a first embodiment of the method for controlling the test circuit at the time of executing the redundancy processing. FIG. 10A is a diagram illustrating a test mode for the redundancy processing start command 28; FIG. 10A is a diagram illustrating a test mode for the redundancy processing command 30.

The redundancy processing start command 28 is executed in a test mode that uses an address and a command. Here, an address at the time of a MRS command is assumed to be, for example, (0F9)H that means the start of the redundancy processing. This address is newly added as a test mode code (for example, (0F9)H). The test-mode detection circuit 22 judges from the address and the command that a test mode is the redundancy processing start command 28. Then, the test circuit 8 is controlled. As a result of inputting this test mode, the redundancy processing control unit 15 controls the chip select circuit 19, the output enable circuit 20, and the redundancy processing enable circuit 21.

The redundancy processing command 30 is executed in a test mode that uses an address, and a command. Here, an address at the time of a MRS command is assumed to be, for example, (0F8)H that means the redundancy processing. This address is newly added as a test mode code (for example, (0F8)H). The test-mode detection circuit 22 judges from the address and the command that a test mode is the redundancy processing. Then, the test circuit 8 is controlled. As a result of inputting this test mode, the fail address analysis unit 16 calculates an address to be actually relieved on the basis of a value of a fail address, and then compares information about the calculated address to be actually relieved with redundancy processing information read out from the DRAM to determine the advisability of redundancy processing.

Figure 11:
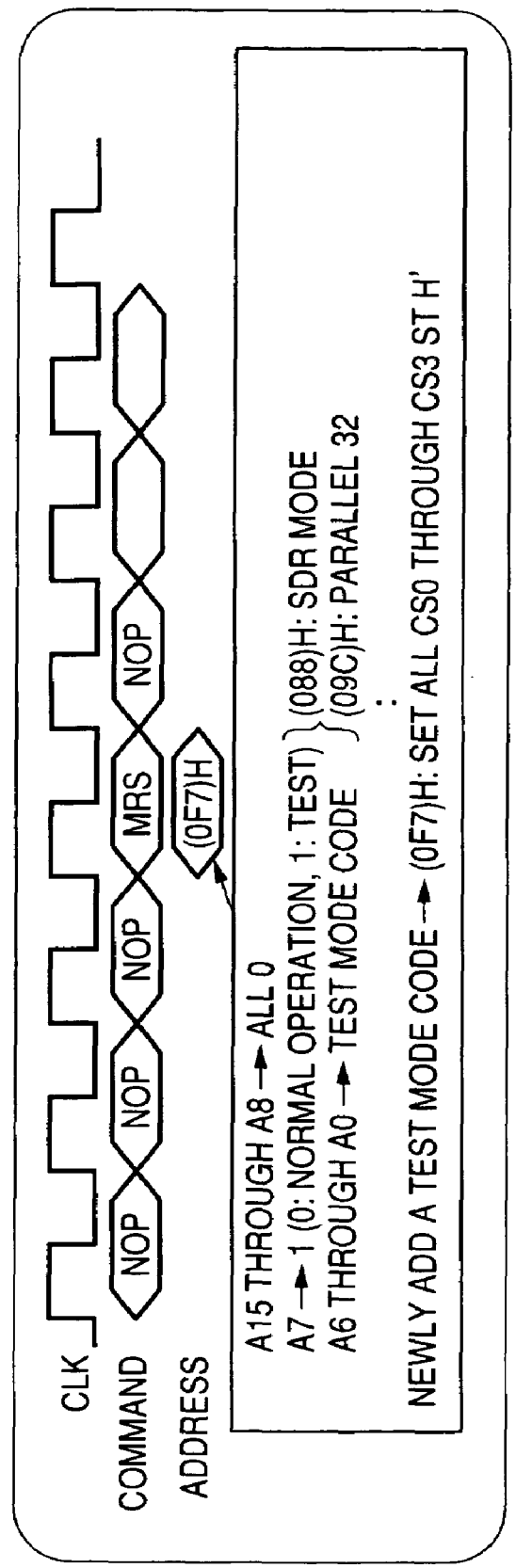
FIG. 11 is a diagram illustrating a test mode for CS settings, which is a second embodiment of a control method for controlling a test circuit at the time of performing the redundancy processing according to the present invention.

FIG. 11 is a diagram illustrating a second embodiment of the method for controlling the test circuit at the time of executing the redundancy processing, and illustrating a test mode that indicates the CS setting command 31. The CS setting command 31 is executed in a test mode that uses an address and a command. Here, an address at the time of a MRS command is assumed to be, for example, (0F7)H that means CS settings. This address is newly added as a test mode code (for example, (0F7)H). The test-mode detection circuit 22 judges from the address and the command that a test mode is the CS setting command 31. Then, the chip select circuit 19 of the test circuit 8 is controlled. As a result of inputting this test mode, it becomes possible to select all of CS0 through CS3.

Thus, by making use of a CS setting test mode, it is also possible to collectively repair (redundancy-process) all of the DRAMs 4 included in the DRAM stacked package 3.

Second Embodiment

Next, a method for testing a DIMM (Dual in-line Memory Module) whose substrate is equipped with a plurality of DRAM stacked packages according to a second embodiment of the present invention will be described.

First of all, a method for testing a DIMM according to the second embodiment of the present invention will be described with reference to FIGS. 5 and 12.

Figure 12:
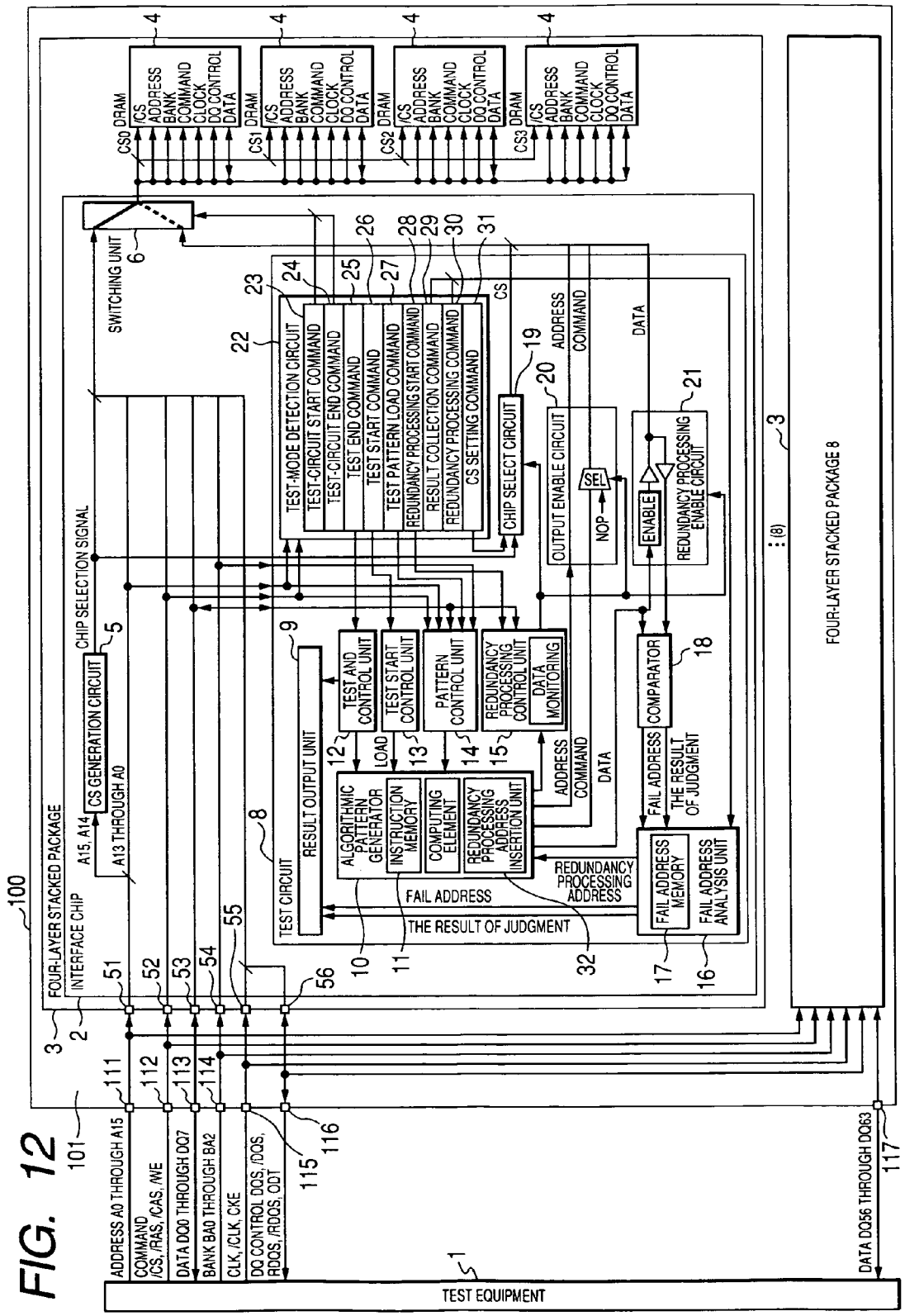
FIG. 12 is a diagram illustrating a configuration of how to test and repair (redundancy-process) a DIMM according to one embodiment of the present invention.

FIG. 12 is a diagram illustrating as one embodiment a configuration in which a DIMM 100 whose substrate is equipped with a plurality of DRAM stacked packages is tested. The DIMM 100 according to a second embodiment of the present invention is configured to have a substrate 101 that is equipped with a plurality of DRAM stacked packages 3 according to the first embodiment shown in FIG. 5. The second embodiment in which the DIMM 100 is tested is different from the first embodiment in that as shown in FIG. 12, connections viewed from the test equipment 1 (more specifically, address, command, bank, clock, and DQ control lines) are common to all of the DRAM stacked packages 3, whereas data lines are independently connected to each DRAM stacked package on a 8-bit basis. As a result, the DIMM 100 whose substrate is equipped with the plurality of DRAM stacked packages 3 can be tested in the same manner as that in the first embodiment.

Next, a method for repairing (redundancy-processing) a DIMM whose substrate is equipped with a plurality of DRAM stacked packages according to the second embodiment of the present invention will be described with reference to FIGS. 5 and 12.

FIG. 12 is a diagram illustrating as one embodiment a configuration in which a DIMM whose substrate is equipped with a plurality of DRAM stacked packages is tested. The DIMM 100 according to a second embodiment of the present invention is configured to have a substrate 101 that is equipped with a plurality of the DRAM stacked packages 3 according to the first embodiment shown in FIG. 5. A point of difference between the second embodiment in which the DIMM 100 is tested and repaired (redundancy-processed) and the first embodiment is that as shown in FIG. 12, connections viewed from the test equipment 1 (more specifically, address, command, bank, clock, and DQ control lines) are common to all of the DRAM stacked packages 3, whereas data lines are independently connected to each DRAM stacked package on a 8-bit basis. Another point of difference is that because an address to be relieved differs on a DRAM basis (there are, for example, 32 DRAMs on the DIMM), with the objective of identifying one DRAM from among for example 32 DRAMs, a DRAM in the DRAM stacked package (for example, four-layer stacked package) 3 is identified with addresses A15, A14, and each DRAM stacked package (for example, four-layer stacked packages 1 through 8) (3) is identified with data bits (DQ56 through DQ63) that differ on a 8-bit basis for example.

Next, how to read redundancy processing information and how to perform the redundancy processing in the DIMM 100 will be described. When redundancy processing information is read out from the test equipment 1, one DRAM 4 included in the DRAM stacked package 3 is first selected according to a chip selection signal by addresses A15, A14. Next, a pattern for test mode entry is applied to the DRAM from the outside. As a result of applying the test mode entry pattern to the one DRAM 4, a redundancy processing circuit (not illustrated) is activated, which causes the switching unit 6 to switch to the test mode. Next, when a command for reading out the redundancy processing information is applied from the algorithmic pattern generator 10 through the output enable circuit 20, the redundancy processing information is output from the one DRAM 4. Then, for each DRAM stacked package 3, the fail address analysis unit 16 compares information about the calculated address to be actually relieved with the redundancy processing information read out from the DRAM on the basis of the fail address value, and thereby determines the advisability of redundancy processing. This makes it possible to determine the advisability of redundancy processing for all of 32 DRAMs included in the DIMM 100.

When the redundancy processing is performed, one DRAM 4 included in the DRAM stacked package 3 is first selected from the test equipment 1 according to a chip selection signal by addresses A15, A14. Next, a pattern for test mode entry is applied to the DRAM 4 from the outside. As a result of applying the test mode entry pattern to the DRAM 4, a redundancy processing circuit is activated, which causes the switching unit 6 to switch to the test mode. Next, when a command for redundancy processing and an address to be relieved are applied to the DRAM 4, the redundancy processing circuit which is built into the DRAM 4 replaces a defective cell with a redundant cell to perform the redundancy processing. However, because address lines are used in common, the same address is applied to all of the four-layer stacked packages. For this reason, the redundancy processing control unit 15 has a function of monitoring data by the redundancy processing control unit 15, and controlling a selection signal of the output enable circuit 20 according to the value so that a NOP command is inputted into DRAMs other than a target to be repaired (redundancy-processed). For example, if the DRAM stacked package 8 includes the target DRAM to be repaired (redundancy-processed), '1' is inputted into data bits DQ56 through DQ63. If the DRAM stacked package 1 is not a target to be repaired (redundancy-processed), '0' is inputted into data bits DQ0 through DQ7. Such a redundancy processing pattern is applied. As a result of monitoring the data bits by the redundancy processing control unit 15, if a value of the data bits is '1', it is necessary to apply a redundancy processing pattern. Accordingly, under the control of the redundancy processing control unit 15, the output enable circuit 20 selects a command for performing the redundancy processing before applying the command. On the other hand, if the data is '0', it is not necessary to apply a redundancy processing pattern. Accordingly, under the control of the redundancy processing control unit 15, the output enable circuit 20 selects an NOP command before applying this command. As a result of the processing described above, it is possible to apply an individual relief address to each of the 32 DRAMs included in the DIMM.

In addition, by making use of the above-mentioned test mode shown in FIG. 11 and the data monitoring function, it is also possible to collectively repair (redundancy-processed) all DRAMs on the DIMM.

The test end command 25 is executed in a test mode that uses an address and a command. The test-mode detection circuit 22 then identifies the test mode. The test end control unit 12 monitors the instruction memory 11 at specified intervals of time by inputting the test mode. If detecting the end of the test, the test end control unit 12 notifies the result output unit 9 of the end. Then, by use of the data lines, the result output unit 9 outputs the result to an external terminal 113 of the DIMM through the external terminal 53 of the package. The test-circuit end command 24 is executed in a test mode that uses an address and a command. The test-mode detection circuit 22 identifies the test mode, and then switches the switching unit 6 to the external terminal side of the package, that is to say, to the external terminal side of the DIMM. The above-mentioned configuration makes it possible to repair (redundancy-process) the DIMM 100.

Third Embodiment

Figure 13:
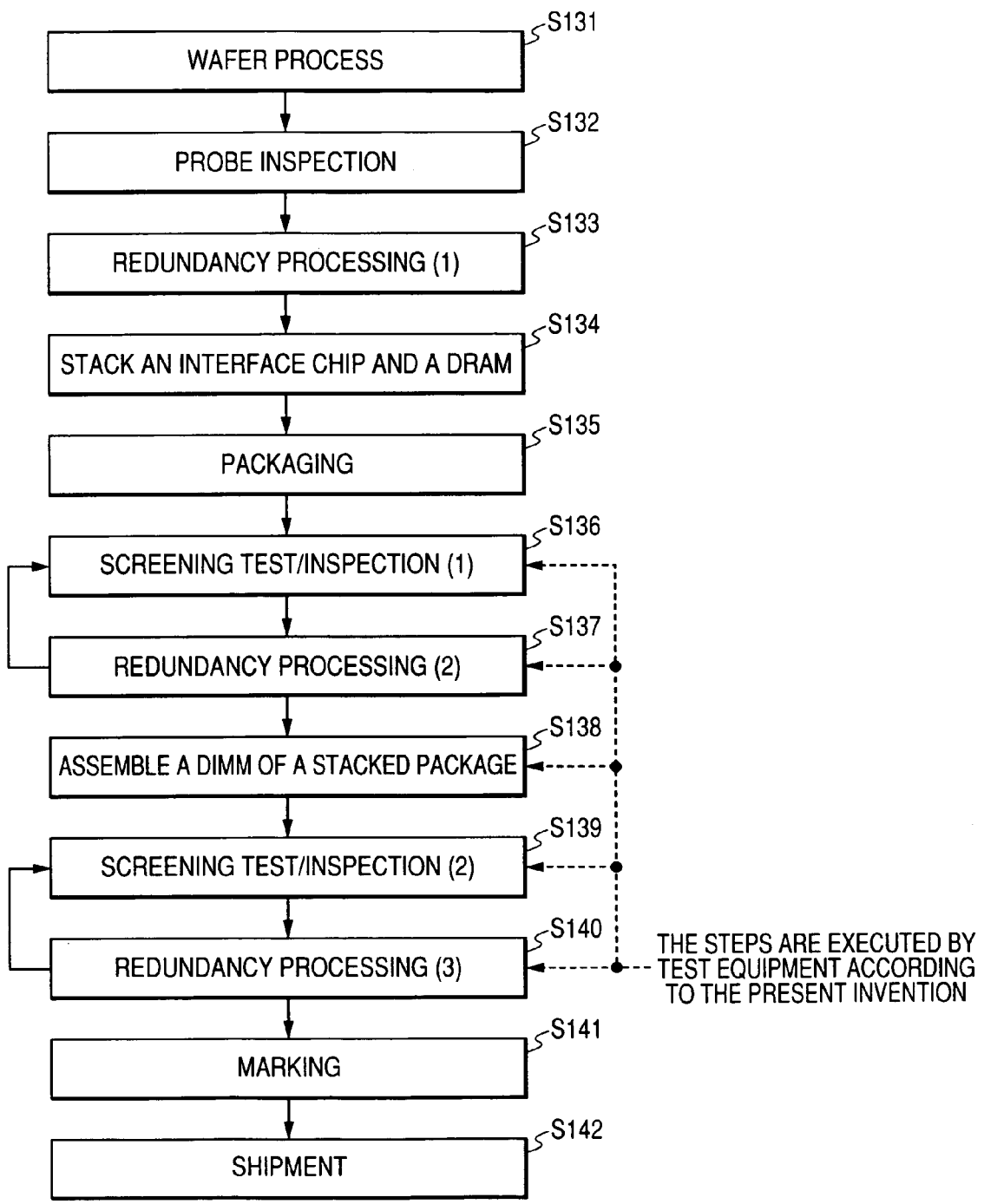
FIG. 13 is a flowchart illustrating how to test DRAMs and a DIMM, and a semiconductor manufacturing method, according to one embodiment of the present invention.

According to a third embodiment of the present invention, test flow of testing a DRAM and a DIMM, to which semiconductor test equipment is applied, and a semiconductor manufacturing method will be described with reference to FIG. 13. A process of testing a DRAM and a DIMM are performed as below. After a wafer process ends (S131), probe inspection in a wafer state is first performed (S132). Then, redundancy processing (1) is performed for a DRAM that is judged to be defective as a result of the probe inspection (S133). Next, the interface chip 2 and the DRAMs 4 are stacked (S134), and packaging is performed (S135). Then, screening inspection (1) and redundancy processing (2) are performed by the test equipment according to the present invention (S136, S137). After that, the DIMM of a stacked package is assembled (S138), and then screening inspection (2) and redundancy processing (3) are performed by the test equipment according to the present invention (S139, S140). When the storage capacity of the DRAM is small, the number of DRAMs whose screening inspection after packaging results in disagreement is small. Accordingly, even if a DRAM whose screening inspection results in disagreement is disposed of as a defective unit, little influence is exerted on yields. However, with an increase in the storage capacity of DRAMs, an occurrence ratio of defects per DRAM chip increases, which causes product yields to decrease. This makes it difficult to reduce the price of the DRAMs. Therefore, by performing the screening inspection (1) and the redundancy processing (2) after the packaging (S135), and the screening inspection (2) and the redundancy processing (3) after the DIMM assembling (S138), by use of the semiconductor test equipment according to the present invention, it becomes possible to perform the screening inspection, the redundancy processing, and another screening inspection that is performed again after the redundancy processing, by use of the same equipment. This makes it possible to omit operations otherwise required while a DRAM stacked package and a DIMM are removed. As a result, the price of DRAMs can be reduced. Incidentally, S141 denotes a marking process, and S142 denotes a shipping process.

FIG. 14 is a diagram illustrating an example of how to fill a data sheet of a test mode for controlling starting and ending of the test circuit 8.

What is claimed is:

1. A method for testing a DRAM stacked package, said test method comprising the steps of:
   providing an interface chip between a plurality of stacked DRAMs and external terminals to which test equipment is connected, said external terminals being used to input/output at least address, command and data;
   implementing said plurality of DRAMs and said interface chip on a package;
   connecting the test equipment to the external terminals of the package;
   applying a test pattern used to test the DRAMs, from the test equipment to the external terminals of the package; and
   testing connections of the address signal lines, the command signal lines, and the data signal lines between the interface chip and the DRAMs included in the package, by comparing each response signal received from the DRAMs in the package with an expected value for judgment.

2. A DRAM stacked package comprising:
   a plurality of stacked DRAMs;
   external terminals to which test equipment is connected, said external terminals being used to input/output at least an address, a command, and data from/to said plurality of DRAMs; and
   an interface chip provided between the plurality of DRAMs and the external terminals;
   wherein;
   said plurality of DRAMs and said interface chip are implemented on a package; and
   said interface chip comprises:
   a test circuit including:
   an algorithmic pattern generator for generating a test pattern used to test the plurality of DRAMs;
   an applying circuit for applying, to the plurality of DRAMs, a test pattern generated by the algorithmic pattern generator;
   a comparator for comparing each response signal received from the plurality of DRAMs with an expected value corresponding to the test pattern so that a judgment is made; and
   a fail address memory, if the comparison made by the comparator results in disagreement, for storing a fail address therein.

3. The DRAM stacked package according to claim 2, wherein:
   said test circuit further comprises:
   a fail address analysis unit for analyzing the fail address stored in the fail address memory to calculate an address to be relieved;
   a relief-address insertion unit for inserting the address to be relieved, which has been calculated by the fail address analysis unit, into the test pattern that is used as a redundancy processing pattern generated by the algorithmic pattern generator; and
   a chip select circuit for applying to the DRAMs a chip selection signal used to select a target DRAM to be repaired from among the plurality of DRAMs.

4. The DRAM stacked package according to claim 3, wherein:
   said fail address analysis unit compares the fail address stored in the fail address memory with redundancy processing information acquired from the DRAMs to determine the advisability of redundancy processing; and
   said algorithmic pattern generator generates the redundancy processing pattern from the result of determining the advisability of redundancy processing, which has been acquired from the fail address analysis unit, and from the address to be relieved, which has been calculated by the fail address analysis unit.

5. A DRAM stacked package comprising:
   a plurality of stacked DRAMs;
   external terminals to which test equipment is connected, said external terminals being used to input/output at least an address, a command, and data from/to said plurality of DRAMs; and
   an interface chip provided between the plurality of DRAMs and the external terminals,
   wherein:
   said plurality of DRAMs and said interface chip are implemented on a package; and
   said interface chip comprises:
   a test circuit including:
   an algorithmic pattern generator for generating a test pattern used to test the plurality of DRAMs;
   an applying circuit for applying, to the plurality of DRAMs, a test pattern generated by the algorithmic pattern generator;
   a comparator for comparing each response signal received from the plurality of DRAMs with an expected value corresponding to the test pattern for judgment;
   a fail address memory, if the comparison made by the comparator results in disagreement, for storing a fail address;
   a fail address analysis unit for analyzing the fail address stored in the fail address memory to calculate a relief address;
   a relief-address insertion unit for inserting the address to be relieved, which has been calculated by the fail address analysis unit, into the test pattern that is used as a redundancy processing pattern generated by the algorithmic pattern generator; and a chip select circuit for applying to the DRAMs a chip selection signal used to select a target DRAM to be repaired from among the plurality of DRAMs.

6. The DRAM stacked package according to claim 5, wherein:

said applying circuit comprises:

an output enable circuit for controlling the output of an address and a command received from the relief-address insertion unit; and a redundancy processing enable circuit for controlling the output of data received from the algorithmic pattern generator; and said test circuit comprises:

a test-mode detection circuit for detecting a redundancy processing test mode on the basis of an address and a command inputted from the external terminals; and a redundancy processing control unit, when the test-mode detection circuit detects the redundancy processing test mode, for controlling the chip select circuit, the output enable circuit, and the redundancy processing enable circuit depending on whether or not the test pattern used as the redundancy processing pattern is to be applied to the DRAMs.

7. A DRAM stacked package comprising:

a plurality of stacked DRAMs;

external terminals to which test equipment is connected, said external terminals being used to input/output at least address, command, and data; and an interface chip provided between said plurality of stacked DRAMs and said external terminals;

wherein:

said plurality of DRAMs and said interface chip are implemented on a package; and said interface chip comprises:

applying means for applying, to the plurality of DRAMs, a test pattern that is inputted from the test equipment into the external terminals; and a comparator for comparing each response signal received from the plurality of DRAMs with an expected value corresponding to the test pattern for judgment; and said DRAMs are tested through the interface chip.

* * * * *